(12) United States Patent
Sottiaux et al.

(10) Patent No.: US 8,998,124 B2
(45) Date of Patent: Apr. 7, 2015

(54) AIRCRAFT WITH ELECTRICALLY CONDUCTIVE NANOCOATING

(71) Applicant: Bell Helicopter Textron Inc., Fort Worth, TX (US)

(72) Inventors: Daniel P. Sottiaux, Flower Mound, TX (US); Hunter Davis, Arlington, TX (US)

(73) Assignee: Bell Helicopter Textron Inc., Fort Worth, TX (US)

( * ) Notice: Subject to any disclaimer, the term of this patent is extended or adjusted under 35 U.S.C. 154(b) by 105 days.

(21) Appl. No.: 13/789,269

(22) Filed: Mar. 7, 2013

(65) Prior Publication Data

US 2014/0252164 A1  Sep. 11, 2014

(51) Int. Cl.
| | |
|---|---|
| *H01B 5/14* | (2006.01) |
| *B64D 45/02* | (2006.01) |
| *C09D 5/24* | (2006.01) |
| *B64C 27/35* | (2006.01) |
| *H05K 9/00* | (2006.01) |

(52) U.S. Cl.
CPC ...... *H01B 5/14* (2013.01); *B64D 45/02* (2013.01); *B64C 27/35* (2013.01); *C09D 5/24* (2013.01); *H05K 9/0079* (2013.01)

(58) Field of Classification Search
USPC ........... 244/1 A; 361/218; 252/500, 511, 512, 252/514, 518.1; 174/2
See application file for complete search history.

(56) References Cited

U.S. PATENT DOCUMENTS

| | | | | |
|---|---|---|---|---|
| 4,155,896 | A | * | 5/1979 | Rennier et al. ................ 523/200 |
| 4,429,341 | A | * | 1/1984 | King ............................. 361/117 |
| 4,623,951 | A | * | 11/1986 | DuPont et al. ................ 361/218 |
| 4,824,713 | A | * | 4/1989 | Brick ............................. 428/144 |
| 4,886,419 | A | * | 12/1989 | McCafferty .............. 416/134 A |
| 5,248,517 | A | * | 9/1993 | Shrier et al. .................... 427/58 |

(Continued)

FOREIGN PATENT DOCUMENTS

| | | |
|---|---|---|
| CN | 101928939 A | 12/2010 |
| WO | 9849057 A1 | 11/1998 |

(Continued)

OTHER PUBLICATIONS

Polyester Matrix Composite reinforced by glass fibers (Fiberglass), Jun. 3, 2012, SubsTech, Accessed Jul. 23, 2014, http://www.substech.com/dokuwiki/doku.php?id=polyester_matrix_composite_reinforced_by_glass_fibers_fiberglass.*

(Continued)

*Primary Examiner* — Joseph W Sanderson
(74) *Attorney, Agent, or Firm* — Fish & Richardson P.C.

(57) ABSTRACT

A device has a first electrically conductive component, a second electrically conductive component, and an electrically conductive nanocoating (ECN) electrically connecting the first electrically conductive component to the second electrically conductive component. An aircraft has an engine, a fuselage, and a device having a first electrically conductive component, a second electrically conductive component, and an electrically conductive nanocoating (ECN) electrically connecting the first electrically conductive component to the second electrically conductive component. A method of providing an electrical conduction path includes providing a first electrically conductive component, providing a second electrically conductive component, and decreasing an electrical resistance between the first electrically conductive component and the second electrically conductive component using an electrically conductive nanocoating (ECN).

17 Claims, 5 Drawing Sheets

(56) References Cited

U.S. PATENT DOCUMENTS

| | | | |
|---|---|---|---|
| 5,665,274 A * | 9/1997 | Long et al. | 252/511 |
| 5,791,592 A * | 8/1998 | Nolan et al. | 244/17.11 |
| 8,178,606 B2 * | 5/2012 | Sang et al. | 524/403 |
| 2004/0051082 A1 * | 3/2004 | Child et al. | 252/500 |
| 2007/0184261 A1 | 8/2007 | Donnadieu | |
| 2010/0230529 A1 * | 9/2010 | Stamps et al. | 244/17.11 |
| 2010/0270513 A1 * | 10/2010 | Haylock et al. | 252/511 |
| 2011/0017867 A1 * | 1/2011 | Simmons et al. | 244/1 A |
| 2011/0049292 A1 * | 3/2011 | Kruckenberg et al. | 244/1 A |
| 2011/0088923 A1 * | 4/2011 | Cawse et al. | 174/2 |
| 2011/0140052 A1 * | 6/2011 | Somasiri et al. | 252/511 |
| 2011/0160372 A1 * | 6/2011 | Youm et al. | 524/403 |
| 2012/0261182 A1 * | 10/2012 | Megaridis et al. | 174/388 |
| 2013/0009001 A1 * | 1/2013 | Gerken et al. | 244/1 A |
| 2013/0082214 A1 * | 4/2013 | Sharaby et al. | 252/511 |
| 2013/0087655 A1 * | 4/2013 | Eddy | 244/1 A |
| 2013/0134364 A1 * | 5/2013 | Hansen et al. | 252/513 |
| 2013/0149934 A1 * | 6/2013 | Sang et al. | 442/399 |
| 2013/0266795 A1 * | 10/2013 | Schultz et al. | 428/323 |
| 2013/0344314 A1 * | 12/2013 | Shokri et al. | 428/221 |
| 2014/0132289 A1 * | 5/2014 | Grossmann et al. | 324/693 |

FOREIGN PATENT DOCUMENTS

| | | |
|---|---|---|
| WO | 2008048705 A2 | 4/2008 |
| WO | 2011062639 A2 | 5/2011 |

OTHER PUBLICATIONS

Communication from a Counter-Part Application; Extended European Search Report; European Application No. EP 13165369.3; Jun. 11, 2013; 10 pgs.

* cited by examiner

AIRCRAFT WITH ELECTRICALLY CONDUCTIVE NANOCOATING

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Exterior aircraft components may be exposed to electrical charges. In some cases, exterior components may be exposed to lightning strikes while in other cases exterior aircraft components may be exposed to electrostatic charges. Some aircraft, such as, but not limited to, helicopters, comprise composite fiber exterior components (e.g., rotor hub components, namely, yokes, cuffs, and/or rotor blades), and/or elastomeric components (e.g., shear bearings, dampers, seals, and/or boots) that are substantially electrically resistive. In cases where an electrically resistive component is disposed between two relatively more electrically conductive components, an electric potential develops, which may tend to conduct along a path internal to the aircraft. When an electrical charge of sufficient power is conducted internally within aircraft components, the internal aircraft components may be undesirably heated, damaged, or otherwise interfered with by the electrical charge. Some exterior aircraft components may comprise an external paint configured to conduct electricity. However, the external paint may require application of a primer coating prior to application of the paint, the paint may be relatively thick so that the coating may tend to break when flexed, and/or the paint may obscure signs of component wear or damage that would otherwise be noticeable by visual inspection.

SUMMARY

In some embodiments of the disclosure, a device is disclosed as comprising a first electrically conductive component, a second electrically conductive component, and an electrically conductive nanocoating (ECN) electrically connecting the first electrically conductive component to the second electrically conductive component.

In other embodiments of the disclosure, an aircraft is disclosed as comprising an engine, a fuselage, and a device comprising a first electrically conductive component, a second electrically conductive component, and an electrically conductive nanocoating (ECN) electrically connecting the first electrically conductive component to the second electrically conductive component.

In yet other embodiments of the disclosure, a method of providing an electrical conduction path is disclosed as comprising providing a first electrically conductive component, providing a second electrically conductive component, and decreasing an electrical resistance between the first electrically conductive component and the second electrically conductive component using an electrically conductive nanocoating (ECN).

BRIEF DESCRIPTION OF THE DRAWINGS

For a more complete understanding of the present disclosure and the advantages thereof, reference is now made to the following brief description, taken in connection with the accompanying drawings and detailed description.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

In some cases, it may be desirable to provide exterior component of an aircraft with an electrically conductive nanocoating (ECN) to at least one of promote a desired electrical charge transmission path, conduct electricity across the component reliably even though the component may flex, conduct electricity across the component via a coating that is resistant to chipping and flaking, and conduct electricity across the component via a coating that does not visually obscure signs of component wear and/or damage. Throughout this disclosure, a nanocoating may be defined as a coating comprising at least one of (1) a thickness comprising a dimension between about 0.1 nanometers to about 200 nanometers and (2) constituent particles comprising a dimension between about 0.1 nanometers to about 200 nanometers.

Figure 1:
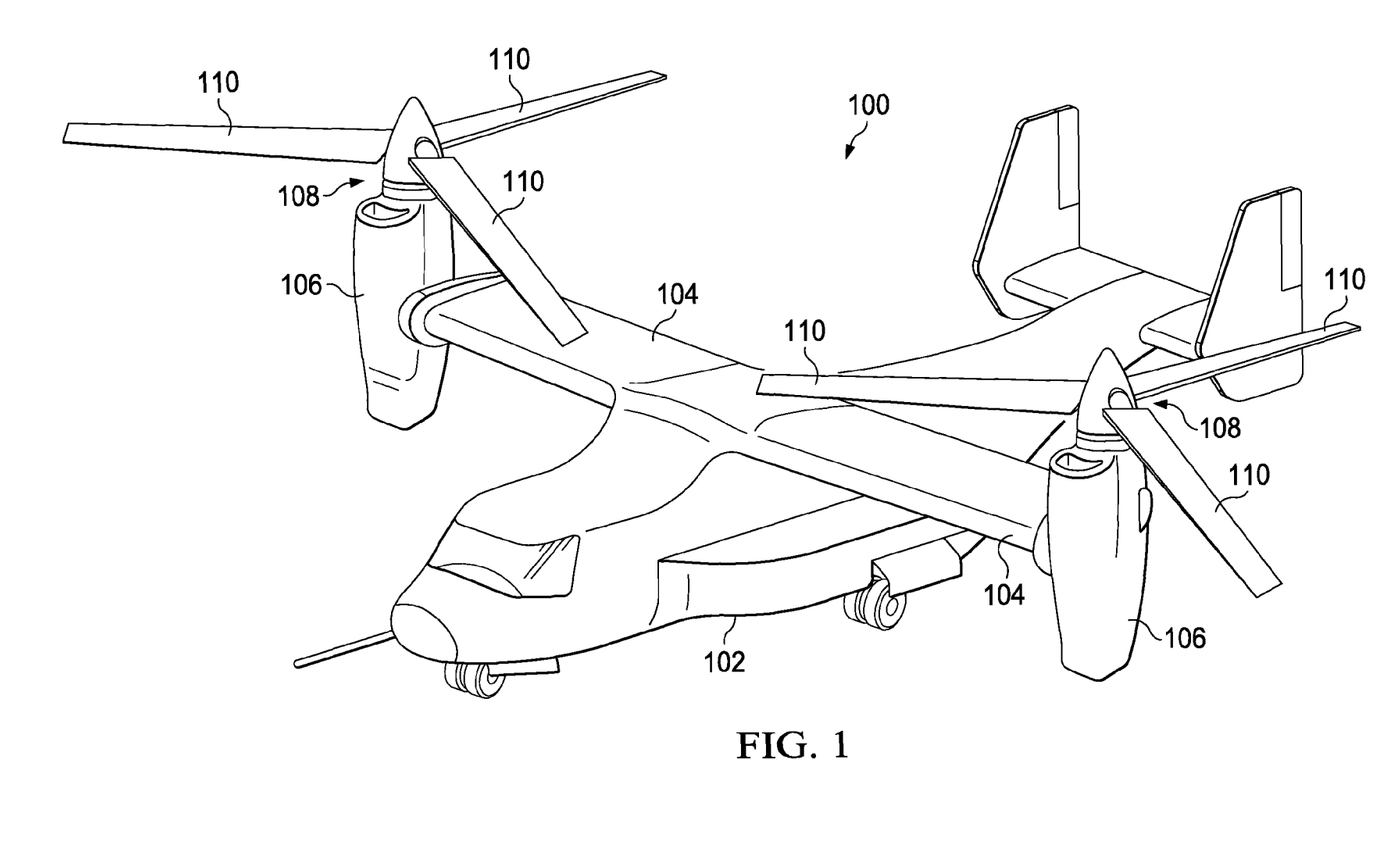
FIG. 1 is an oblique view of an aircraft according to an embodiment of the disclosure.

Referring now to FIG. 1, a tiltrotor rotary-wing aircraft 100 comprising an ECN 200 is shown. The aircraft 100 is shown in a helicopter mode of flight operation. The aircraft 100 comprises a fuselage 102, wings 104, nacelles 106, and rotor systems 108. The wings 104 are attached to the fuselage 102 and carry the nacelles 106. The nacelles 106 may substantially enclose and/or carry engines and/or transmissions for powering the rotor systems 108. The rotor systems 108 may comprise composite components such as, but not limited to, a composite hub, composite rotor blades 110, elastomeric dampers, elastomeric bearings, and/or any other suitable component. Some of the above-described components may generally be electrically resistive, electrically non-conductive, and/or an electrical insulator as compared to other components of the aircraft 100. In some embodiments, the ECN 200 may be provided to an exterior surface of one or more the fuselage 102, wings 104, nacelles 106, rotor systems 108, and/or rotor blades 110 and/or any component of the fuselage 102, wings 104, nacelles 106, rotor systems 108, and/or rotor blades 110.

Figure 2:
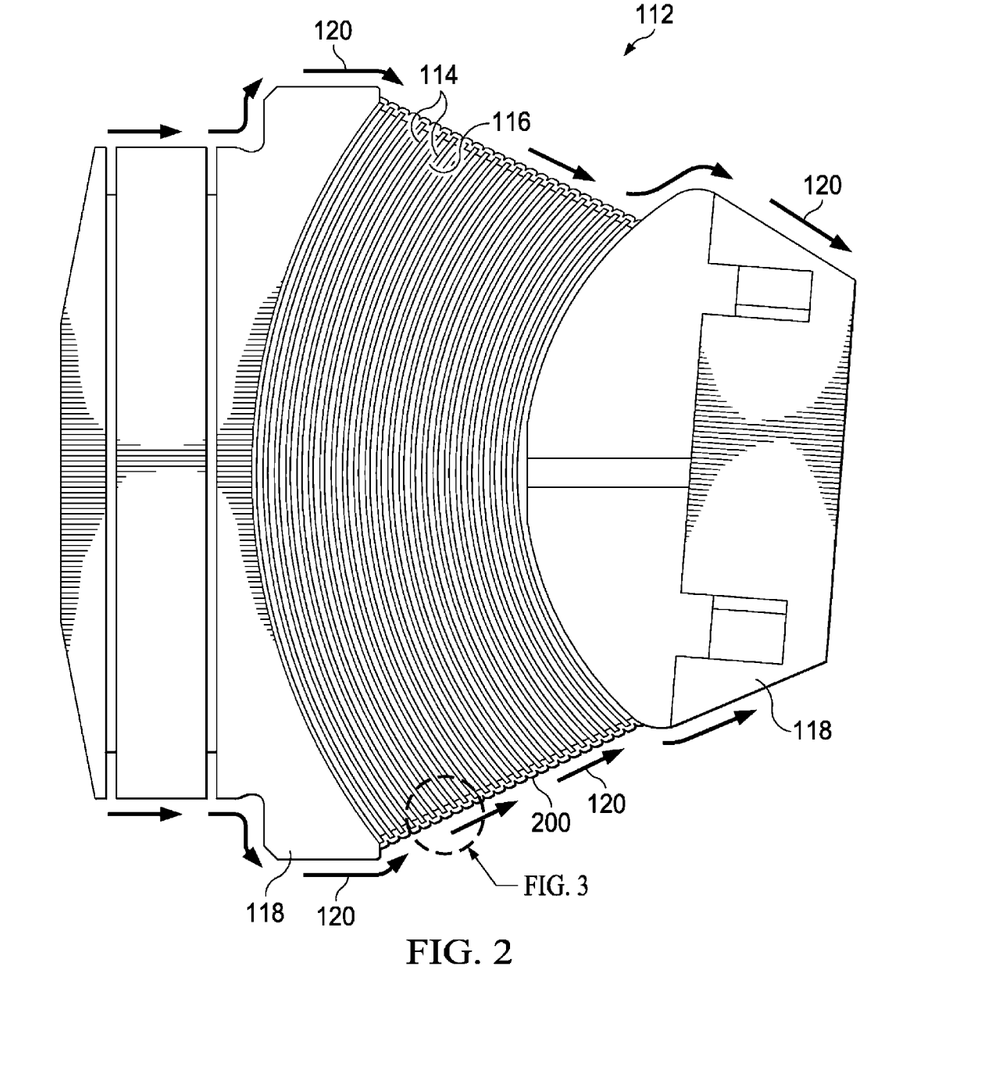
FIG. 2 is an orthogonal cross-sectional view of a bearing of the aircraft of FIG. 1.

Referring now to FIG. 2, an orthogonal cross-sectional view of a centrifugal force bearing 112 is shown. In some embodiments, the centrifugal force bearing 112 may be a component of the rotor system 108. The centrifugal force bearing 112 generally comprises a stack of offset metallic shims 114 that are generally bonded to adjacent elastomeric elements 116. The bearing 112 is generally flexible insofar as the elastomeric elements 116 may elastically deform, shear, expand, and/or compress in response to applied forces. In some embodiments, the centrifugal force bearing 112 is provided with an ECN 200 that provides an electrically conductive path across the plurality of electrically conductive shims 114 and the electrically resistive elastomeric elements 116. In cases where the centrifugal force bearing 112 further comprises electrically conductive mounts 118, the ECN 200 may generally serve as an improved electrical transmission and/or conduction path 120 between the mounts 118. Accordingly, the above-described provision of the ECN 200 to the bearing 112 enables the bearing 112 to serve as a singular conductive element relative to the components to which the mounts 118 are attached. In some embodiments, the ECN 200 may be not be provided to an entire exterior portion of the shims 114 and 116 and/or may be provided in conductive path strips that may each electrically connect the mounts 118 to each other.

Figure 3:
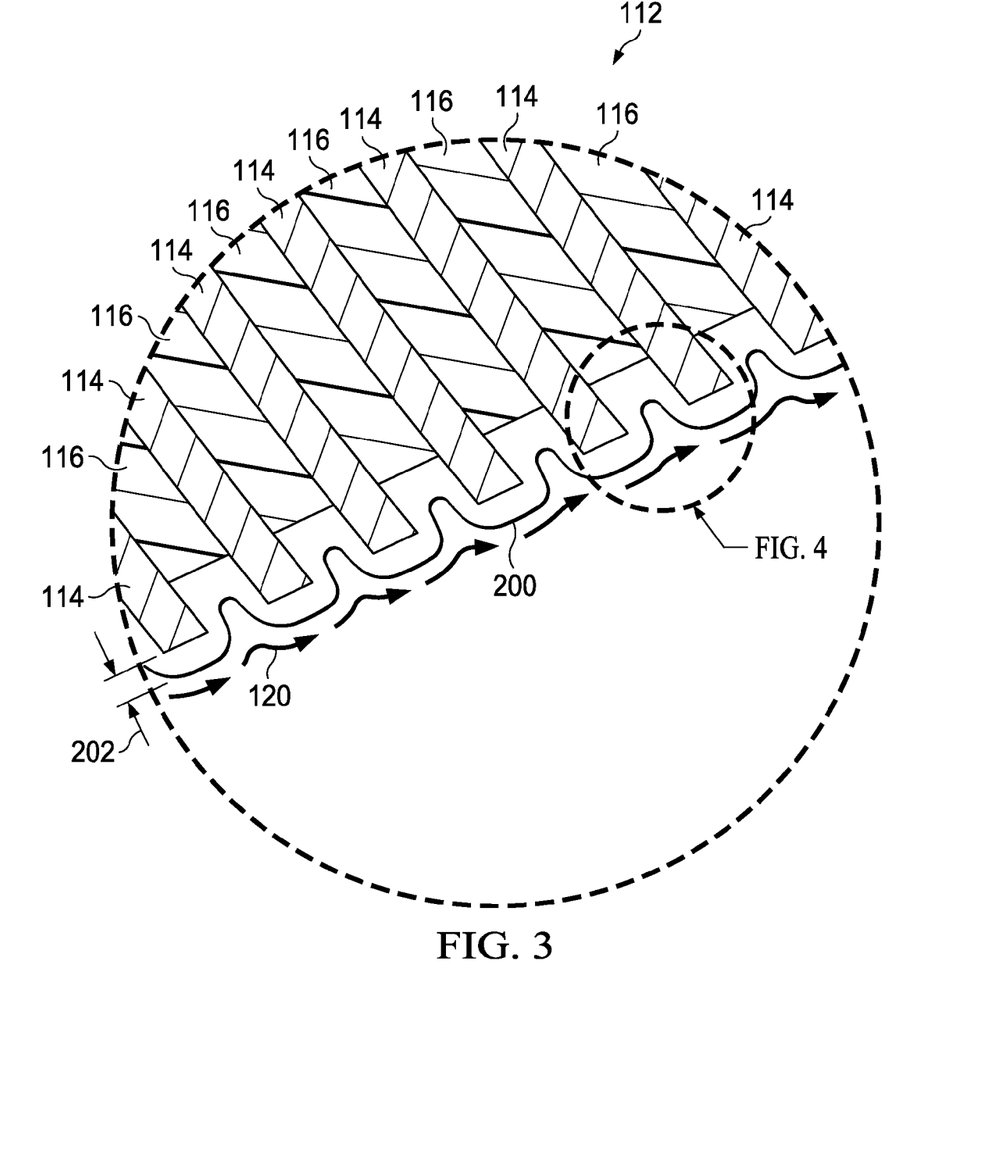
FIG. 3 is a partial view of the bearing of FIG. 2.

Referring now to FIG. 3, a close-up orthogonal partial view of the centrifugal bearing 112 is shown. In this embodiment, the ECN 200 is shown in greater detail and generally comprises a thickness 202 measured relative to at least one of the shims 114 and elastomeric elements 116. In some embodiments, the thickness 202 may vary along the conduction path 120. In some embodiments, the thickness 202 may comprise a value of about 0.1 nanometers to about 200 nanometers, about 1 nanometer to about 175 nanometers, about 10 nanometers to about 150 nanometers, about 75 nanometers to about 125 nanometers, about 100 nanometers, and/or any other suitable combination of nanocoating thicknesses. In some embodiments, the ECN 200 may be substantially transparent and/or otherwise visually non-obstructive to visual inspection of the bearing 112 for wear and/or damage. In some embodiments, the thickness 202 may be selected to be thinner or thicker at particularly high flexure locations of the bearing 112.

Figure 4:
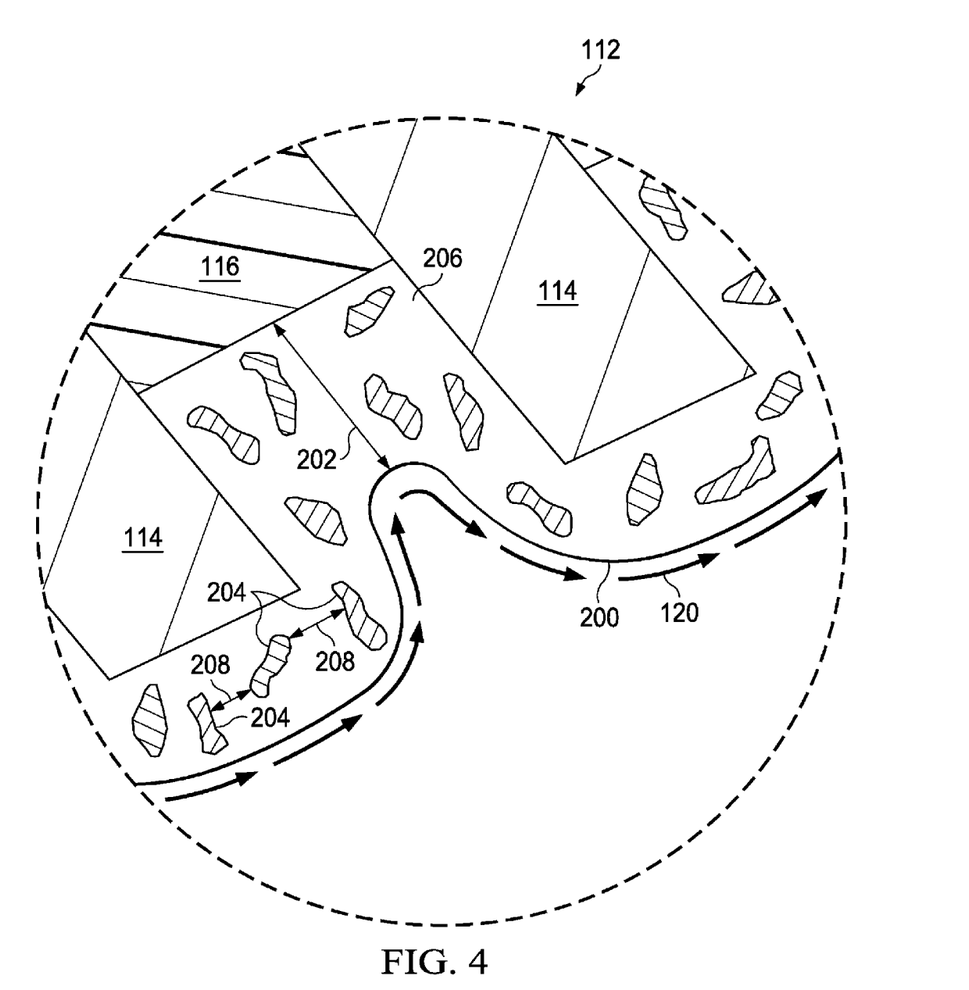
FIG. 4 is a partial view of the bearing of FIG. 3.

Referring now to FIG. 4, an even closer orthogonal partial view of the centrifugal bearing 112 is shown. In this embodiment, the ECN 200 is shown in still greater detail and comprises electrically conductive particles (ECPs) 204. The ECPs 204 may comprise metal, carbon such as graphite, electrically conductive biological material, polymer material and/or any other electrically conductive material. In this embodiment, the ECPs 204 are generally disposed within a substrate 206 that may itself be electrically conductive. In alternative embodiments, the ECN 200 may comprise no substrate 206, but rather, may be comprised substantially of ECPs 204. Regardless the manner in which the ECP 204 locations are maintained relative to the bearing 112, a sufficient number of adjacent ECPs 204 comprise charge path distances between adjacent ECPs 204 that ensure the ECN 200 is electrically conductive as a whole. Depending on the ECP 204 material and the substrate 206 material, a critical path distance may be known and defined as a maximum distance along which electrons may transfer between adjacent ECPs 204 at a particular electrical charge condition. The distances 208 may change depending on the flexure and/or position of the bearing 112 so that in a first position of the bearing 112 an electrical charge may be transferred between adjacent ECPs 204 while in a second position of the bearing 112 the charge path distances 208 are too large for the same electrical charge to be transferred between the adjacent ECPs 204. In such cases, the electrical charge may be transferred via other adjacent ECPs 204 whose charge path distances 208 are more favorable for electrical conduction in the second position of the bearing 112. In some embodiments, the ECPs 204 may comprise a variety of maximum dimension sizes 210, and the sizes 210 may comprise a value of about 0.1 nanometers to about 200 nanometers, about 1 nanometer to about 175 nanometers, about 2 nanometers to about 100 nanometers, about 3 nanometers to about 50 nanometers, about 5 nanometers, and/or any other suitable combination of electrically conductive nanoparticle maximum dimension size 210. In some embodiments, the distances 208 and/or sizes 210 may be selected to provide a localized response to deformation of the bearing 112.

Figure 5:
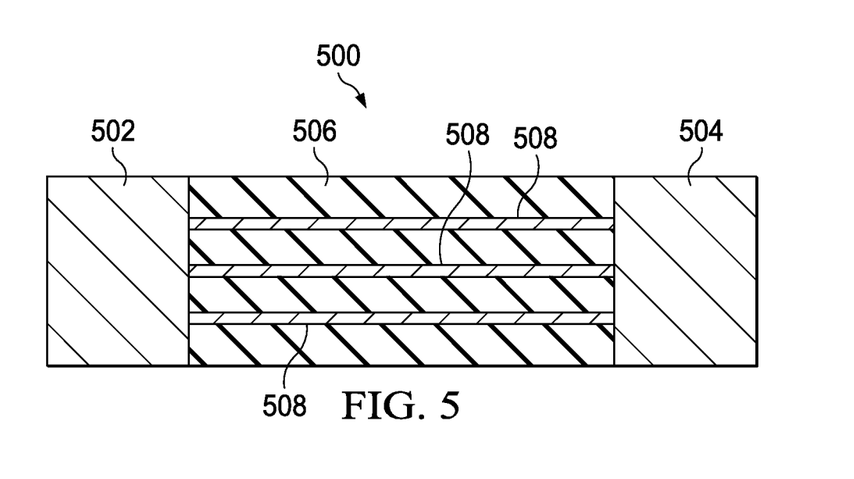
FIG. 5 is a schematic partial view of a fuselage according to an embodiment of the invention.

Referring now to FIG. 5, a partial orthogonal view of a fuselage 500 comprising an ECN is shown. In some embodiments, the fuselage 500 comprise a first electrically conductive component 502, a second electrically conductive component 504, and a relatively less conductive or electrically insulative component 506 disposed between the first electrically conductive component 502 and the second electrically conductive component 504. In some cases, the first electrically conductive component 502 may be electrically connected to the second electrically conductive component 504 by disposing one or more electrical traces 508 on the insulative component 506. The electrical traces 508 may comprise an ECN substantially similar to ECN 200.

Figure 6:
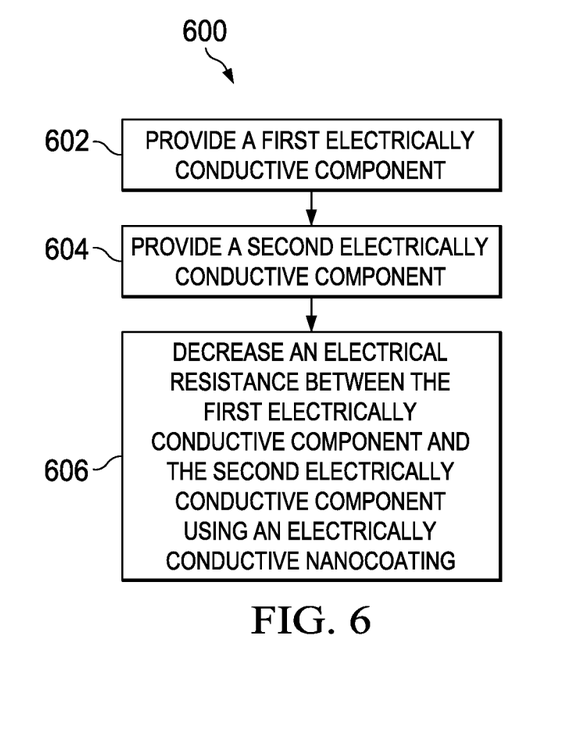
FIG. 6 is a flowchart of a method of providing an electrical conduction path according to an embodiment of the disclosure.

Referring now to FIG. 6, a flowchart of a method 600 of providing an electrical conduction path is shown. The method 600 may begin at block 602 by providing a first electrically conductive component. In some embodiments, the first electrically conductive component may comprise a first of the two mounts 108. The method 600 may progress at block 604 by providing a second electrically conductive component. In some embodiments, the second electrically conductive component may comprise a second of the two mounts 108. The method 600 may progress at block 606 by decreasing an electrical resistance between the first electrically conductive component and the second electrically conductive component using an ECN. In some embodiments, the ECN may be substantially similar to ECN 200.

The ECN 200 and ECNs substantially similar to ECN 200 may be utilized to selectively reduce resistances of electrical paths, provide new electrical paths, reduce electric potential between different parts of an aircraft, and/or otherwise alter or direct transmission of electricity on any aircraft, vehicle, stationary object, and/or material that may be exposed to electrical charges. Further, the teachings disclosed and applied to the bearing 112 and the fuselage 500 may be similarly applied to any other aircraft and/or aircraft component, such as shear bearings in helicopter main and/or tail rotor assemblies. The ECNs disclosed herein may be applied to vulcanized elastomeric assemblies, seals, composite panels and/or bushings that may be improved by being electrically conductive. The ECNs disclosed herein may be applied to aircraft components to manage and/or discharge static electricity without the need to perform extensive surface preparation as a prerequisite to applying the ECNs.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Unless otherwise stated, the term "about" shall mean plus or minus 10 percent of the subsequent value. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present invention.

What is claimed is:

1. A device, comprising:
   a first electrically conductive component;
   a second electrically conductive component;
   an electrically insulative component disposed directly between the first electrically conductive component and the second electrically conductive component, the electrically insulative component to elastically deform in response to an applied force; and
   an electrically conductive nanocoating (ECN) disposed on the electrically insulative component and electrically connecting the first electrically conductive component to the second electrically conductive component, the ECN to elastically deform with the electrically insulative component, wherein the nanocoating is a coating comprising at least one of:
   (1) a thickness comprising a dimension between 0.1 nanometers to 200 nanometers; and
   (2) constituent particles comprising a dimension between 0.1 nanometers to 200 nanometers;
   wherein the ECN is configured to maintain electrical connection while elastically deforming with the electrically insulative component.

2. The device of claim 1, wherein at least one of the first electrically conductive component and the second electrically conductive component comprises a component of a bearing.

3. The device of claim 1, wherein the ECN is disposed on the first electrically conductive component and the second electrically conductive component.

4. The device of claim 1, wherein the ECN comprises a paint configured for application without the need for a primer.

5. The device of claim 1, wherein the ECN is substantially transparent.

6. The device of claim 1, wherein the constituent particles of the ECN maintains electrical conductivity of the ECN based on a critical path distance between the constituent particles while the ECN elastically deforms along with the electrically insulative component.

7. The device of claim 1, wherein the thickness of the nanocoating at a flexure location of the electrically insulative component is based on a degree of flexure of the electrically insulative component at the flexure location.

8. The device of claim 1, wherein the ECN is disposed on an entire exterior of the electrically insulative component between the first electrically conductive component and the second electrically conductive component.

9. The device of claim 1, wherein the ECN is disposed on the electrically insulative component in conductive path strips between the first electrically conductive component and the second electrically conductive component.

10. An aircraft, comprising:
    an engine;
    a fuselage; and
    a device, comprising:
    a first electrically conductive component;
    a second electrically conductive component;
    an electrically insulative component disposed directly between the first electrically conductive component and the second electrically conductive component, the electrically insulative component to elastically deform in response to an applied force; and
    an electrically conductive nanocoating (ECN) disposed on the electrically insulative component and electrically connecting the first electrically conductive component to the second electrically conductive component, the ECN to elastically deform with the electrically insulative component, wherein the nanocoating is a coating comprising at least one of:
    (1) a thickness comprising a dimension between 0.1 nanometers to 200 nanometers; and
    (2) constituent particles comprising a dimension between 0.1 nanometers to 200 nanometers;
    wherein the ECN is configured to maintain electrical connection while elastically deforming with the electrically insulative component.

11. The aircraft of claim 10, wherein the aircraft comprises a helicopter.

12. The aircraft of claim 10, wherein the device comprises a centrifugal force bearing.

13. The aircraft of claim 10, wherein the device comprises a shear bearing.

14. The aircraft of claim 10, wherein the constituent particles of the ECN maintains electrical conductivity of the ECN based on a critical path distance between the constituent particles while the ECN elastically deforms along with the electrically insulative component.

15. The aircraft of claim 10, wherein the thickness of the nanocoating at a flexure location of the electrically insulative component is based on a degree of flexure of the electrically insulative component at the flexure location.

16. A method of providing an electrical conduction path, comprising:
    providing a first electrically conductive component;
    providing a second electrically conductive component;
    providing an electrically insualtive component comprising an elastomeric element configured to elastically deform in response to an applied force;
    disposing the electrically insulative component between the first electrically conductive component and the second electrically conductive component;
    decreasing an electrical resistance between the first electrically conductive component and the second electrically conductive component using an electrically conductive nanocoating (ECN), wherein the nanocoating is a coating comprising at least one of:

(1) a thickness comprising a dimension between 0.1 nanometers to 200 nanometers; and
(2) constituent particles comprising a dimension between 0.1 nanometers to 200 nanometers; and disposing the ECN on the electrically insulative component, wherein the ECN on the elastomeric element of the electrically insulative component is configured to elastically deform with the elastomeric element and maintain electrical connection while elastically deforming along with the elastomeric element.

17. The method of claim 16, wherein at least one of the first electrically conductive component and the second electrically conductive component comprises a component of a bearing.

* * * * *